United States Patent [19]

Harrington

[11] 4,005,364
[45] Jan. 25, 1977

[54] DIGITAL CIRCUIT FOR MEASURING RELATIVE FREQUENCY IN SEPARATE PULSE TRAINS

[75] Inventor: Timothy M. Harrington, Sierra Madre, Calif.

[73] Assignee: MDH Industries, Inc., Monrovia, Calif.

[22] Filed: June 21, 1976

[21] Appl. No.: 698,103

Related U.S. Application Data

[63] Continuation-in-part of Ser. No. 524,368, Nov. 15, 1974, abandoned.

[52] U.S. Cl. .............................. 324/79 D; 328/140; 328/136; 328/71
[51] Int. Cl.² ................... H03K 5/18; G01R 23/10
[58] Field of Search ......... 324/79 D; 328/140, 136, 328/71

[56] References Cited

UNITED STATES PATENTS

| | | | |
|---|---|---|---|
| 3,304,504 | 2/1967 | Horlander | 324/79 D |
| 3,537,003 | 10/1970 | Planta et al. | 324/79 D |
| 3,571,760 | 3/1971 | Schwartz | 324/79 D |
| 3,909,714 | 9/1975 | Nakano | 324/79 D |

Primary Examiner—John S. Heyman
Attorney, Agent, or Firm—Arthur V. Doble

[57] ABSTRACT

A digital circuit determines the maximum frequency present in a first pulse train and indicates when a selected fraction of this maximum frequency is exceeded in subsequent pulse trains. The invention comprises a prescaler circuit for the purpose of reducing the frequency of the input pulse train to a level suitable for a digital period-measuring circuit; a digital period-measurement circuit that measures the period of the output of the prescaler and compares that measured value to a stored value; a frequency-multiplier circuit that produces the reference frequency used to measure the period in the period-measurement circuit; and a control circuit to operate the circuits in a first mode for storing a digital value representative of the maximum frequency present in the input pulse train, and in a second mode for comparing the frequency of subsequent pulse trains with the value stored in the first mode. The control circuit produces an output signal when the frequency of the subsequent pulse train exceeds a selected fraction of the maximum frequency present in the first pulse train.

14 Claims, 3 Drawing Figures

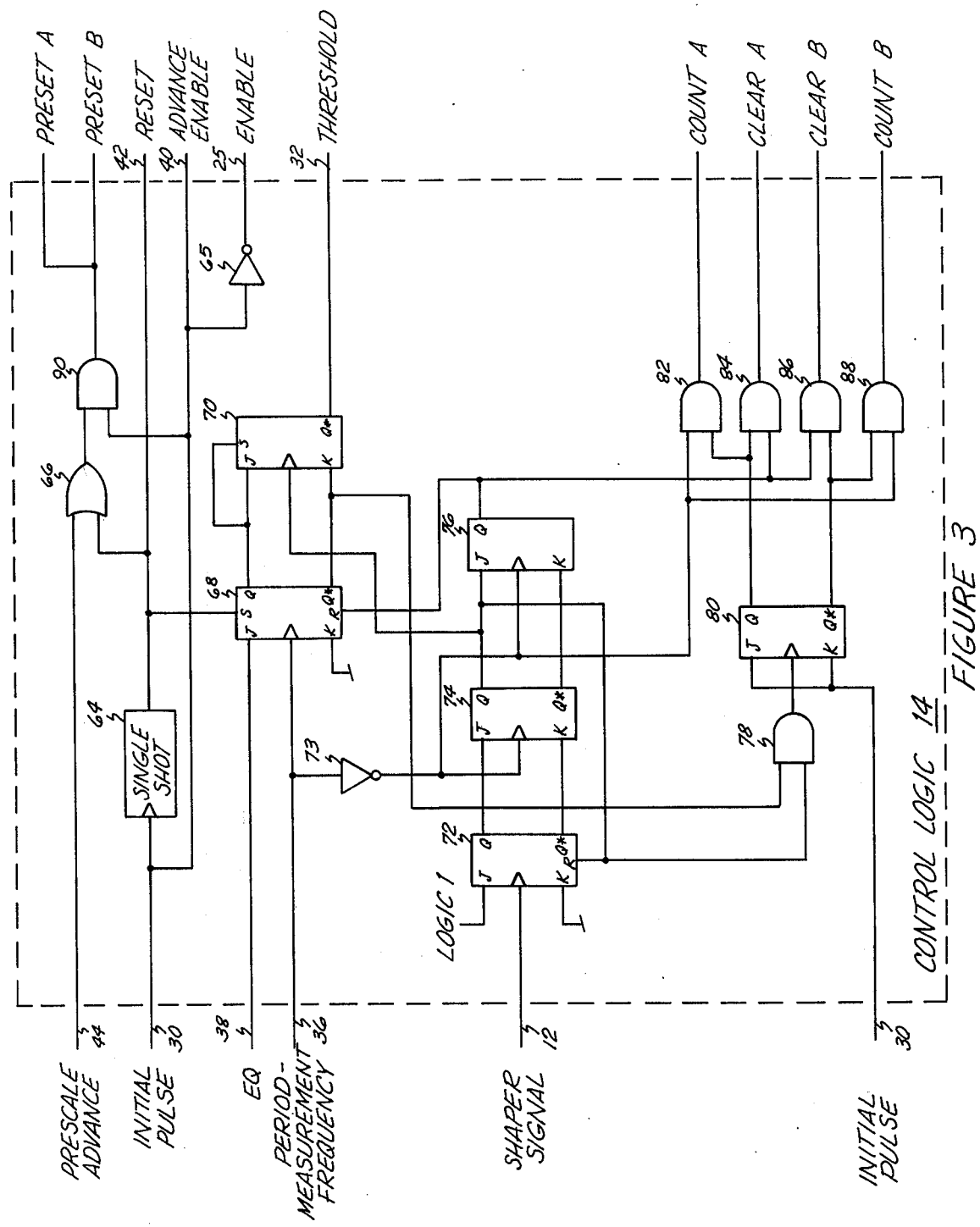

DIGITAL CIRCUIT FOR MEASURING RELATIVE FREQUENCY IN SEPARATE PULSE TRAINS

This application is a continuation-in-part of U.S. patent application Ser. No. 524,368 filed Nov. 15, 1974, now abandoned.

BACKGROUND OF THE INVENTION

1. Field of the Invention

This invention relates to apparatus for measuring properties or electrical characteristics in an electrical circuit and more particularly to a digital circuit for measuring relative frequency in separate pulse trains.

2. Description of the Prior Art

Various electronic instruments may produce digital pulse trains, or groups of pulses, in which the spacing between pulses or its reciprocal, the instantaneous frequency, is variable. The pulse trains are distinguished from one another by the fact that during the time between pulse trains only a very few pulses will be present. Pulse trains of this type may be produced by such devices as voltage-to-frequency or current-to-frequency converters handling input signals of a pulsating nature.

One common data-processing task to be performed on such pulse trains is the determination of the interval during which the instantaneous frequency exceeds a given threshold. This data-processing problem becomes more complex when this threshold must be adaptive. For example, the threshold frequency could be a pre-set fraction of the maximum frequency generated during an earlier pulse train. In the case where the input pulses arise from a current-to-frequency converter handling pulsating input currents, this data-processing task is equivalent to determining the time interval during which the input current exceeded a preset fraction of the peak input current in a previous current pulsation.

In the prior art, frequency-to-voltage converters and counter-computers were commonly used for similar data-processing tasks. A frequency-to-voltage converter (or frequency-to-current converter) would generate a continuously-varying output signal, which ideally would be proportional to the instantaneous input frequency. If the peak value of this analog output signal were to be sampled and stored for a given input pulse train, then the resulting reference voltage (or current) could then be compared to later signals from the converter in order to determine if they exceeded a pre-set fraction of the peak value of the first signal. Because a filter was necessary to smooth the output signal from the frequency-to-voltage converter and this filter must inevitably introduce timing errors, this approach functions accurately over only a limited range of input frequencies or requires an adaptive analog filter. Furthermore, this approach requires the careful adjustment which is typical of analog circuits and also is subject to their problems involving drifts and component uncertainties.

Thus, a digital approach would be preferable in order to eliminate these difficulties associated with analog circuits. For example, counter-computer circuits could be used to count the input pulses for known periods, thus determining the input frequency averaged over this period. Digital computation using these results could then determine such quantities as the maximum (average) frequency and the time during which the average frequency exceeded a given threshold.

Not only are such circuits relatively complex, but also they have limitations imposed by the rate at which samples can be made and the computations performed. These limitations become particularly severe if the time between pulses changes significantly on a pulse-to-pulse basis, so that the frequency averaged over several pulses becomes a poor representation of the instantaneous frequency. In that case, the counter-computer approach generates timing errors of the same nature as those resulting from the filtered output of a frequency-to-voltage converter.

SUMMARY OF THE INVENTION

Applicant herein has conceived of a new and useful digital circuit for measuring the relative instantaneous frequency present in pulse trains. The circuit determines the maximum instantaneous frequency present in one pulse train and indicates when a selected fraction of this maximum frequency is present in subsequent pulse trains. This circuit includes an automatic prescaler to adjust the incoming signal frequencies to the range of values accommodated by a period-measuring circuit. The period-measuring circuit measures the number of clock pulses between prescaled signals, and stores the minimum value during the first pulse train. During subsequent pulse trains the clock-pulse frequency is multiplied by a rational fraction, M/N, and the number measured using this slower clock is compared with the stored number. When the measured number is less than the stored number, the instantaneous input frequency is above the rational fraction times the stored value for maximum frequency in the first pulse train, and this condition is so indicated by an output signal.

The present invention has several features of novelty over the prior art, including the use of digital techniques and feedback to provide wide dynamic range in both amplitude and interval, the lack of apparent drifts, and an essentially adjustment-free design.

This invention has as one of its objects the measurement of a series of variable-frequency pulse trains, such as produced by a current-to-frequency converter measuring a pulsating input current. The frequency of the variable-frequency pulse train is proportional to the amplitude of the current applied to the current-to-frequency converter. This invention provides an indication whenever the frequency of the variable-frequency pulse train exceeds a selected fraction of the maximum frequency detected in the first variable-frequency pulse train of the series.

It is another object of this invention to provide for measuring variable-frequency pulse trains utilizing digital techniques and feedback to provide wide dynamic range in both amplitude and interval, no apparent drift, and essentially adjustment-free characteristics.

For a better understanding of the present invention, together with other and further objects thereof, reference is made to the following description taken in connection with the accompanying drawings in which preferred embodiments of the invention are illustrated, the scope of the invention being pointed out and contained in the appended claims.

BRIEF DESCRIPTION OF THE DRAWINGS

FIG. 3 is a diagram illustrating the details of the control logic section of FIG. 1.

DESCRIPTION OF THE PREFERRED EMBODIMENTS

Figure 1:
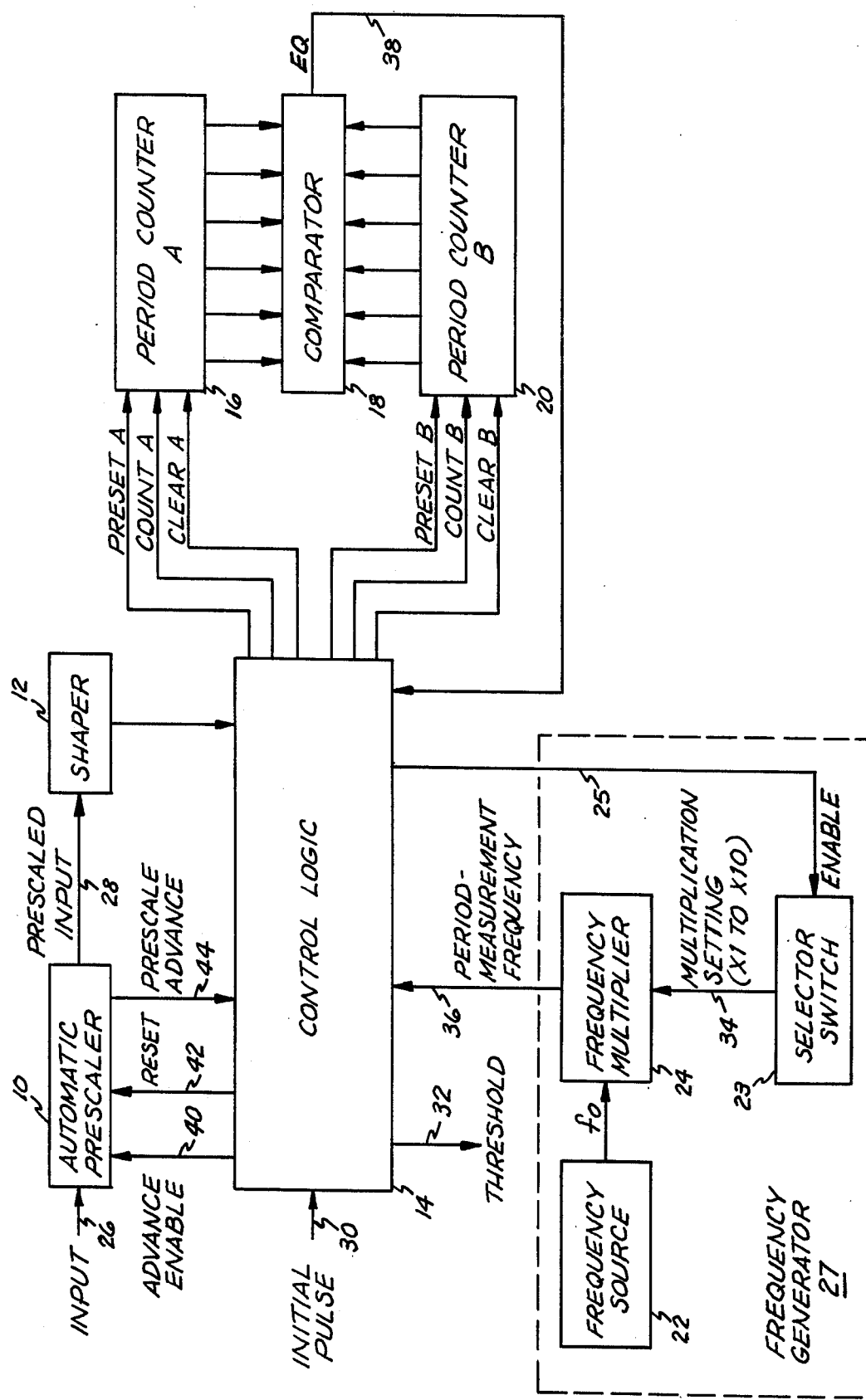
FIG. 1 is a block diagram depicting a preferred embodiment of the invention in terms of functional blocks.

FIG. 1 illustrates the major elements of one embodiment of this invention. The INPUT SIGNAL 26 is applied to an automatic prescaler 10 where it is converted to a PRESCALED INPUT 28 and applied to a shaper 12. The output of the shaper 12 goes to the control logic 14 where it is used to control operation of the two period counters 16 and 20. The number stored in the period counters 16 and 20 is compared by the comparator 18, and the EQ signal 38 is generated whenever the two numbers are equal. The EQ signal 38 is used by the control logic 14 for the generation of the control signals to the period counters 16 and 20, and in the generation of the output signal THRESHOLD 32. Frequency source 22, frequency multiplier 24, and selector switch 23 together make up a frequency generator 27 for producing the PERIOD-MEASUREMENT-FREQUENCY signal 36. A frequency source 22 generates a reference for the frequency multiplier 24. The frequency multiplier 24 generates a multiple of the reference frequency, $f_o$, from frequency source 22 in response to the MULTIPLICATION SETTING signal 34. This MULTIPLICATION SETTING signal 34 in the preferred embodiment includes the ten integer steps, 1 through 10, inclusive. The output from the frequency multiplier 24 is the PERIOD-MEASUREMENT FREQUENCY signal 36, which is counted by period counters 16 and 20 to produce a number representative of the period of the INPUT SIGNAL 26.

Figure 2:
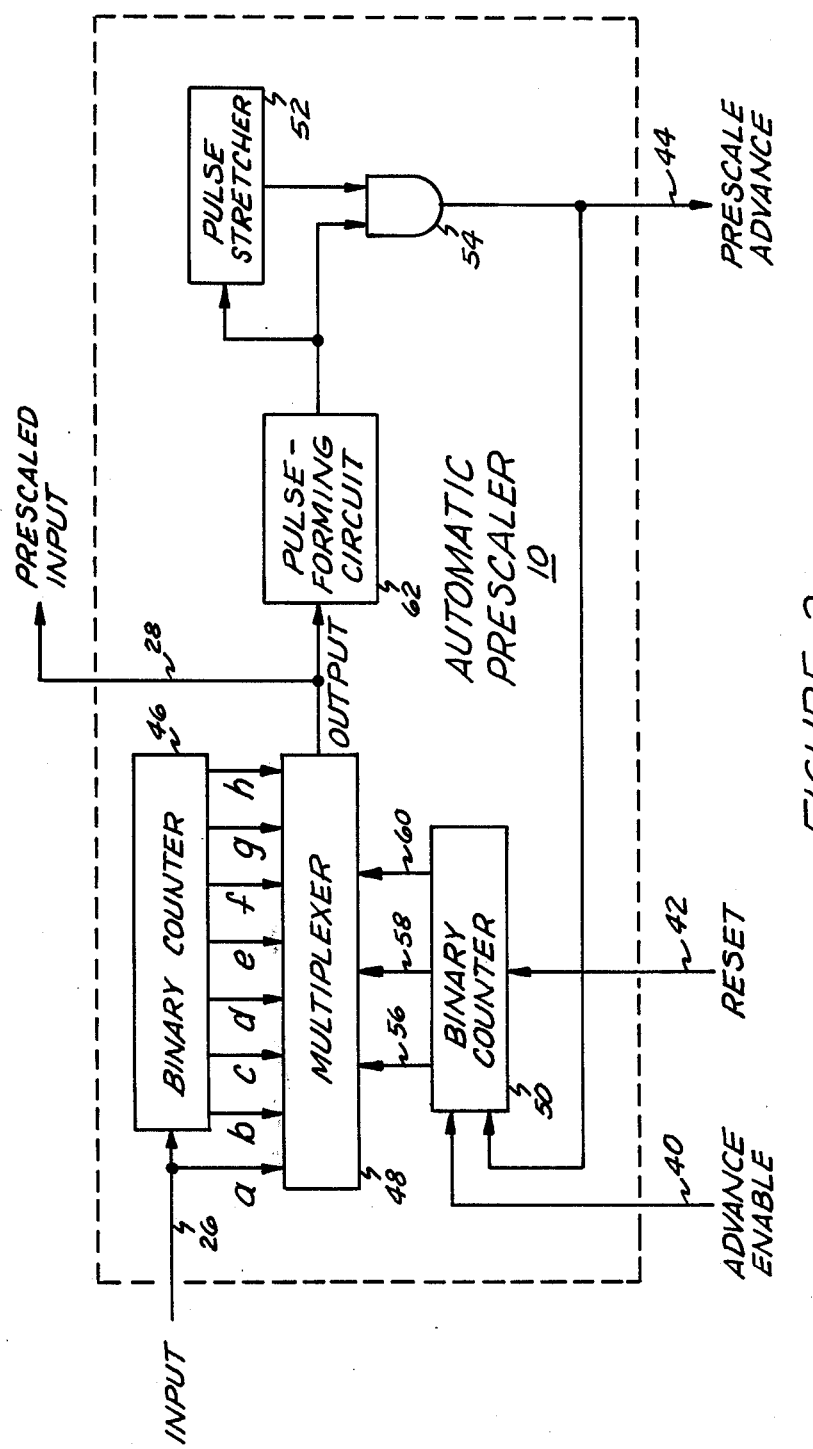
FIG. 2 is a diagram illustrating the details within the automatic prescaler section of FIG. 1.

The automatic prescaler 10 operates in a first mode when the input INITIAL PULSE 30 to the control logic 14 is in its logic 1 state, and operates in a second mode when INITIAL PULSE 30 is at a logic 0. FIG. 2 shows the elements making up the automatic prescaler 10 in more detail to aid in understanding the two operating modes.

The automatic prescaler 10 consists of a first binary counter 46, which contains a multiplicity of binary-counter stages. The preferred embodiment shows seven stages. This counter 46 is coupled to a multiplexer 48 which connects one of its eight inputs, $a$ through $h$, inclusive, to its output in response to the three input controls 56, 58 and 60.

The multiplexer 48 connects input $a$ to its output when controls 56, 58 and 60 are at logic 0, and connects successively inputs $b$, $c$, $d$, $e$, $f$, $g$ and $h$ as the controls 56, 58 and 60 cycle through the binary-count states from 000 to 111. Input 56 has the binary weight of 1, input 58 has weight 2, and input 60 has weight 4 in this sequence. It will thus be seen that the frequency of the output from the multiplexer 48 is related to the frequency of the input to the automatic prescaler 10 through division of the input frequency by 2 to the exponent obtained by considering input controls 56, 58 and 60 as a 3-bit binary number. The ratio of output to input frequencies thus ranges from 1:1 to 1:128 in seven binary steps.

The output from the multiplexer 48 is connected to pulse-forming circuit 62, which responds to logic-0-to-logic-1 transitions at the output of the multiplexer 48 by producing a short pulse, approximately 10 $\mu s$ in length in this preferred embodiment.

The signal from the pulse-forming circuit 62 is applied to the pulse stretcher 52 and to the "and" 54. The pulse stretcher 52 generates a fixed-width signal beginning at the trailing edge of the signal from the pulse-forming circuit 62, and lasting for a fixed time interval, which is 40 $\mu s$ in this preferred embodiment. The "and" gate 54 is designed to produce a PRESCALE ADVANCE output 44 only when both inputs to gate 54 are at a logic 1 state. Thus it will be seen that a PRESCALE ADVANCE output 44 only occurs if outputs from multiplexer 48 occur closer together than 50 $\mu s$ in this embodiment. If the ADVANCE-ENABLE signal is a logic 1, then when the signal 44 from "and" gate 54 occurs, the second binary counter 50 is advanced by one count, decreasing the output frequency from multiplexer 48 by a factor of 2 and tending thereby to maintain the PRESCALED INPUT 28 at a frequency less than 20 kHz. If the ADVANCE ENABLE 40 is at logic 0, then the above-described sequence does not change the counter 50, and the prescaler ratio is fixed at whatever value it may have reached in response to previous signals 26, 42, and 40.

In the first mode of operation of the prescaler 10, the prescaler 10 is initially reset by the generation within the control logic 14 of a RESET pulse 42 to the automatic prescaler 10 in response to a logic-0-to-logic-1 transition on the INITIAL-PULSE input 30. This logic 1 on input 30 causes the ADVANCE-ENABLE input 40 to the automatic prescaler 10 to assume a logic-1 value. Under these conditions the prescaler 10 will insert sufficient prescaling between its input 26 and its output 28 to limit the maximum frequency of output 28 to 20 kHz. Thus, for example, if the input signal frequency starts at zero or some small value, and then rises to 500 kHz and then returns to near zero, the automatic prescaler 10 will successively insert prescale factors of 2, 4, 8, 16 and 32 as the input frequency reaches 20, 40, 80, 160 and 320 kHz, respectively. The prescale factor of 32 will remain stored within the automatic prescaler 10 as the input frequency drops below its 500-kHz peak value.

It should be clear that this automatic-prescale function may be applied to a larger or smaller range of prescale ratios, and that frequencies other than the 20-kHz maximum used for this preferred embodiment may be used.

The shaper 12 is connected to the output from the automatic prescaler 10. It serves to assure that the pulses applied to the control logic 14 are of a suitable amplitude and duration, and are properly synchronized to the internal functions of the control logic 14.

The period counters 16 and 20 are six-bit binary up counters that operate under control of the control logic 14. The inputs to counter 16 labeled CLEAR A and PRESET A force the counter 16 to the zero and full-scale values, respectively. The COUNT-A input causes the counter 16 to advance from 0 to full scale in normal binary-count sequence. Counter 20 operates in the same manner in response to the respective "B" control signals.

The comparator 18 examines the outputs of counters 16 and 20, and produces the EQ signal 38 whenever counters 16 and 20 contain the same numeric value.

The control logic 14 operates the counters 16 and 20 and the comparator 18 in a first and second mode, said first mode for counters 16 and 20 and comparator 18 being operative at the same time that the first mode for the automatic prescaler 10 is operative, and said second mode for counters 16 and 20 and comparator 18 being operative at the same time that the second mode for the automatic prescaler 10 is operative.

During said first mode of operation, no more than one of the two period counters 16 and 20 is allowed to count at any given instant. When a counter is allowed to count, it counts signal 36, period measurement frequency. That counter that is counting is selected by following a procedure implemented within the control logic 14. This determination as to which counter, 16 or 20, is permitted to count is made each time that the control logic 14 receives a pulse from the shaper 12. I have defined the time at which the determination is being made as "now." I have defined the interval prior to "now" and back in time to the last-previous output of the shaper as "old," and the interval following the present determination and extending until the next output of shaper 12 as "new." If an EQ pulse signal 38 was generated by comparator 18 during the "old" interval, then the counter that was counting during said "old" interval is cleared to zero and that counter is allowed to count up from zero during the "new" interval. If no EQ pulse signal 38 was generated by comparator 18 during the "old" interval, then the counter that was not counting in the "old" is cleared, leaving the value that resided in the counter that was counting during the old interval unchanged, and allow the cleared counter to count in the new interval. It can thus be seen that by implementing this procedure the period counters 16 and 20 measure the number of pulses of the period-measuring frequency 36 between successive pulses from shaper 12, and that the control logic 14 by controlling the counters 16 and 20 to change functions from store to count only when the EQ signal 38 from comparator 18 is not detected causes a number to be obtained and stored that represents the minimum period of all the signals from the shaper 12 exhibited during the input pulse train that occurs when the first mode of operation is selected.

The operation of the automatic prescaler 10 and the period counter logic described above and involving the operation of control logic 14, comparator 18 and period counters 16 and 20 interact because each time that the prescaler 10 increases its ratio the measured minimum-period number stored in counter 16 or 20 is no longer correct. In the first operating mode, a correct new minimum-period number is obtained by presetting both period counters 16 and 20 each time that a PRESCALE ADVANCE 44 occurs, and re-enabling one counter of counters 16 and 20 upon the next-following occurrence of an output from shaper 12.

The second mode of operation of the period counters 16 and 20 and in the comparator 18 occurs when the INITIAL-PULSE signal 30 is at a logic zero. As explained above, in this second mode the automatic prescaler 10 remains fixed at a value determined during prior operation. Said second mode of operation of the counters 16 and 20 involves one of the counters 16 and 20 remaining fixed with a value arrived at by applying the procedure described in the first-mode discussion above, such fixed value being representative of the minimum period of the output of the shaper 12, and such value further being representative of the maximum frequency of the input signal 26 after including the effects of the prescaling that takes place in the automatic prescaler 10, said minimum period and maximum frequency both being those that occurred during the time that the INITIAL-PULSE input 30 was at a logic-1 level.

The counter 16 or 20 that is not storing the representative fixed value described above is cleared to zero at each occurrence of an output from shaper 12, and counts PERIOD-MEASUREMENT-FREQUENCY pulses 36 in the intervals between shaper 12 output signals. The comparator 18 produces an EQ signal 38 whenever the numbers in counters 16 and 20, one stored and the other counting, become equal.

During this second mode of operation of the period counters 16 and 20 and the comparator 18, the signal THRESHOLD 32 is produced by the control logic 14 under the following conditions. THRESHOLD 32 becomes a logic 1 whenever the output of shaper 12 occurs if there has been no output EQ 38 from comparator 18 since the last-previous shaper 12 output. THRESHOLD 32 is forced to logic 0 whenever EQ 38 occurs.

The frequency source 22 is any convenient signal frequency. In the preferred embodiment, the frequency source is a 20-kHz oscillator signal stabilized by a quartz-crystal oscillator. It will be seen from the discussion of the frequency multiplier 24 and the discussion of the system operation that follows that the frequency source does not need to be precisely known because all measurements are scaled to the frequency source through the multiplier 24.

The frequency multiplier 24 is a phase-locked frequency-multiplication circuit of a type familiar to those versed in the art. The circuit acts to produce at its output a precise multiple of the input frequency, said multiple being digitally entered via the MULTIPLICATION-SETTING input 34. In the preferred embodiment, the frequency multiplication ratio is one of ten discrete values, the ten integral values being between 1 and 10. During the first mode of the operation of the system characterized by the INITIAL-PULSE input being a logic 1, the multiplication setting is set to × 10 by the action of the enable signal 25 from control logic 14, and thus the PERIOD-MEASUREMENT FREQUENCY 36 becomes 200 kHz. Thus the function performed by the automatic prescaler 10 in said first mode to adjust the PRESCALED INPUT 28 to shaper 12 to be no faster than 20 kHz assures that the fixed number that resides in one of the period counters 16 or 20 at the end of said first mode will be 10 or greater and, because other circuitry not shown inhibits operation if the maximum frequency of the input 26 does not exceed 10 kHz, the maximum value stored in the counter 16 or 20 will be 20.

During said second mode of operation the frequency multiplier 24 is programmed to one of 9 lower multiples of the output of frequency source 22. The particular multiple is selected by a selector switch 23 shown in FIG. 1. In the preferred embodiment this is a 9-position switch marked with 9 values from 0.1 to 0.9. These positions select multiplication settings of X1 to X9 as the multiple of the output $f$ of frequency source 22 that is present at the PERIOD-MEASUREMENT FREQUENCY 36 output of frequency multiplier 24.

Consider one example of operation in said second operating mode in which the frequency of the input 26 starts at a low value and increases. At sufficiently low values of INPUT 26 frequency, EQ 38 signals will occur between each shaper 12 output, and the THRESHOLD SIGNAL 32 will remain logic 0. As the input frequency increases, EQ 38 pulses will continue to occur, keeping THRESHOLD 32 at logic 0, until the period between outputs from shaper 12 equals 10 divided by M times the value stored in period counter 16 or 20 during said first mode of operation. M in this case is the value of the multiplication setting 34 that controls frequency multiplier 24. Because that stored value and prescale ratio inserted by prescaler 10 were determined by and are representative of the maximum frequency that occurred during said first mode, the THRESHOLD SIGNAL 32 becomes a logic 1 when the frequency of the input 26 equals the fraction of said maximum frequency determined by the setting of the multiplier during the second operating mode divided by said multiplier setting during the first operating mode.

The control logic 14 is comprised of an arrangement of logic elements that control the operations of the automatic prescaler 10, the period counters 16 and 20, and the frequency generator 27. The control logic operates these circuits together in a first and second operating mode depending upon the state of the signal INITIAL PULSE 30. In the first operating mode the INITIAL PULSE 30 signal is a logic 1 and the circuits digitally determine and store values representative of the maximum frequency attained by the pulses applied to INPUT 26 of the automatic prescaler 10. In the second operating mode the control logic 14 produces the signal THRESHOLD 32 whenever the frequency of INPUT 26 exceeds the fraction selected by selector switch 23 of the maximum frequency determined during the preceding first operating mode.

The preferred embodiment of control logic 14 is depicted in FIG. 3. The signals PRESET A and PRESET B are made using OR gate 66 and AND gate 90. The inputs to OR gate 66 are the signals PRESCALE ADVANCE 44 and the output from the single shot 64 connected to INITIAL PULSE 30. This connection causes both period counters 16 and 20 to be set to all ones upon application of INITIAL PULSE 30 and also whenever the automatic prescaler is advanced by the PRESCALE ADVANCE 44 signal while INITIAL PULSE 30 is true. AND gate 90 prevents the PRESET A and PRESET B signals from being produced when INITIAL PULSE 30 is not true.

The single shot 64 circuit produces a single pulse when the INITIAL PULSE 30 signals moves from logic 0 to logic 1. This single shot output makes RESET 42 to reset the automatic prescaler 10 at the start of the INITIAL PULSE 30 signal. RESET 42 also sets flip-flop 68 to assure that the first measurement by PERIOD COUNTERS A and B following the INITIAL PULSE 30 logic 0 to logic 1 transition is disregarded.

The signal INITIAL PULSE 30 controls the automatic prescaler 10 by connecting to the ADVANCE ENABLE 40 signal so that binary counter 50 only counts when INITIAL PULSE 30 is logic 1. INITIAL PULSE 30 is passed through an inverter 65 to make the signal ENABLE 25 to the Frequency Generator 27. ENABLE 25 causes the MULTIPLICATION SETTING 34 from selector switch 23 to become the value X10 without regard to the switch setting while INITIAL PULSE 30 is a logic 1, and causes the MULTIPLICATION SETTING 34 to correspond to the setting of selector switch 23 while INITIAL PULSE 30 is a logic 0.

The signal EQ 38 is applied to the J input of flip flop 68. Flip flop 68 is a JK flip flop, whose output becomes a logic 1 immediately following a logic 0 to logic 1 transition of the PERIOD-MEASUREMENT FREQUENCY 36 signal of EQ 38 is a logic 1 at that time. Flip flop 68 then remains with its Q output at a logic 1 and its Q* output at a logic 0, without regard to EQ 38, until a logic 1 on the R input of flip flop 68 returns Q to a logic 0 and Q* to a logic 1. This circuit has the effect of detecting and storing the occurrance of an EQ 38 signal at the time it is valid, the logic 0 to logic 1 transition of PERIOD MEASUREMENT FREQUENCY 36, until the next succeeding SHAPER 12 signal.

Flip flop 70 is another JK flip flop connected to flip flop 68 so that the Q* output of 70 becomes a logic 1 if flip-flop 68 Q* output is a logic 1 at the time that the clock input to flip flop 70, the Q output of 74, undergoes a logic 0 to logic 1 transition. The Q* output of flip flop 70 also becomes a logic 0 whenever a logic 1 is present on the S input to flip flop 70. The connections between flip-flops 68 and 70, when considered in conjunction with the relative timing of the clock inputs and the signals to the R inputs of the two flip flops 68 and 70 produces a logic 1 on the THRESHOLD 32 output whenever an EQ 38 signal doesn't occur between two successive SHAPER 12 signals, and causes THRESHOLD 32 to become a logic 0 whenever the EQ 38 signal occurs in conjunction with a logic 0 to logic 1 transition of the PERIOD-MEASUREMENT 36 signal.

The SHAPER 12 signal is connected to the clock input of JK flip flop 72. The J input of 72 connects to a fixed logic 1 signal, and the K input of 72 connects to a fixed logic zero. The Q output of 72 becomes a logic 1 following each logic 0 to logic 1 transition of the SHAPER 12 signal. Flip flops 74 and 76 together form a pulse generating circuit operating in synchronism with the PERIOD-MEASURE 36 signal inverted by inverter 73. Thus the Q output of flip flop 74 becomes a logic 1 for the interval between the first and second logic 1 to logic 0 transitions of FREQUENCY MEASUREMENT 36 following the logic 0 to logic 1 transition of the SHAPER 12 signal, and similarly the Q output of flip flop 76 becomes a logic one between the second and third logic 1 to logic 0 transitions of FREQUENCY MEASUREMENT 36. This circuit thus produces the operation described above for flip flops 68 and 70 because following each SHAPER 12 signal flip flop 70 is clocked. If 68 is reset then THRESHOLD 32, the output of flip flop 70, becomes a logic 1. Thereafter flip flop 68 is reset by the output of flip flop 76 in preparation for the next interval between SHAPER 12 signals.

Control of period counter A 16 and period counter B 20 is performed by circuit elements 78, 80, 82, 84, 86 and 88. If INITIAL PULSE 30 is a logic 1, then each time that a logic 0 to logic 1 transition of the SHAPER 12 signal occurs the JK flip flop 80 will change state if EQ 38 hasn't been detected and stored by flip flop 68. This has the effect of toggling flip flop 80 if and only if the INITIAL PULSE 30 signal is true and the interval between the last two SHAPER 12 logic 0 to logic 1 transitions was too short to allow an EQ 38 to be generated. The outputs from flip flop 80 control generation of the signals CLEAR A, CLEAR B, COUNT A and COUNT B which are connected to period counters 16 and 20 using AND gates 82, 84, 86 and 88. The connections are arranged so that after the logic 0 to 1 transition from SHAPER 12, first the decision to toggle or not to toggle 80 is made, and then one of the two counters 16 or 20 is cleared and the same counter is allowed to count.

What is claimed as new is:

1. A digital circuit for measuring when and if the instantaneous frequency of a pulse train, by which is meant the reciprocal of the time between individual pulses in the same pulse train, bears a selected relationship to the maximum instantaneous frequency of a previous pulse train, comprising:
   a. prescaler means having an adjustable scaling factor, which can be automatically varied such that the instantaneous frequency of the output pulse train from the prescaler in response to an input pulse train with a wide range of instantaneous frequencies is less than a predetermined maximum, and having storage for the value of said scaling factor so that the same scaling factor can be used with subsequent pulse trains;
   b. frequency-generating means for generating pulses with a single repetition frequency selected from a multiplicity of possible frequencies;
   c. digital period-measurement means for measuring and storing the value of the time interval between individual pulses produced at the prescaler-means output, said measurement using the frequency of the pulses produced at the output of the frequency-generating means;
   d. comparator means for comparing the stored and measured values within the digital period-measurement means; and
   e. control means for operating the prescaler means, frequency-generating means, digital period-measurement means, and comparator means in a first mode to determine a digital value representative of the maximum instantaneous frequency in a pulse train, and in a second mode to indicate when the instantaneous frequency in a subsequent pulse train bears a selected relationship to the maximum frequency determined in the first mode.

2. The circuit of claim 1, above, wherein the circuit measured when and if the instantaneous frequencies of the subsequent pulse trains equal a fraction, N/M, of the maximum frequency of the reference pulse train, and wherein:
   a. the frequency-generating means in the first mode produces a reference frequency $Mf_o$, which is used by the digital period-measurement means to digitize the pulse-separation intervals at the output of the prescaler and to determine and store for reference purposes the value of the minimum pulse separation in terms of this frequency; and
   b. the frequency-generating means in the second mode produces a frequency $Nf_o$, which is one of a multiplicity of frequencies, and which is used by the digital period-measurement means to determine the value of the pulse separations at the prescaler output in terms of this second frequency;
   whereby, by comparing the numbers representing the digitization of these pulse separations in terms of two frequencies related to each other by the ratio N/M, the circuit determines when and if the instantaneous frequency in a later pulse train equals N/M times the maximum frequency in a previous reference pulse train.

3. The circuit of claim 1, above, wherein the prescaler means comprises:
   a. counting means for producing a multiplicity of pulse-train signals, the instantaneous frequency within each one of which bears a unique relationship to the frequency of the input pulse train;
   b. selecting means for selection of one of the multiplicity of signals from the counting means;
   c. means for examining the output of the selecting means to determine if the instantaneous frequency at the output of the selecting means exceeds a predetermined value; and
   d. means for causing the selecting means to select a lower-frequency signal when the output signal from the examining means indicates that the frequency has exceeded the predetermined value.

4. The circuit of claim 3, above, wherein the counting means is a first binary counter having a multiplicity of binary-counter stages.

5. The circuit of claim 3, above, wherein the means for selecting one of a multiplicity of outputs from the counting means is a multiplexer circuit that connects one of the counting-means outputs to the output of the selecting means, thereby producing an instantaneous frequency at the selecting-means output related to the input pulse-train frequency by 2 to an exponent ranging between zero and some maximum integral value.

6. The circuit of claim 3, above, wherein the means for examining the output of the selecting means and for signaling the output comprises:
   a. a pulse-forming circuit for forming a pulse of a first predetermined width each time a transition occurs at the selector-means output;
   b. a pulse-stretching circuit for generating a pulse of a second predetermined width following the end of the pulse-forming-circuit output; and
   c. an "and" gate for generating an output signal when the outputs from the forming circuit and the stretching circuit occur at the same time;
   whereby said examining means produces a signal from the "and" gate if the selecting-means frequency exceeds the value calculated by adding together the values of the first and second predetermined pulse widths and then taking the reciprocal thereof.

7. The circuit of claim 3, above, wherein the means for causing the selecting means to select a lower-frequency signal comprises a second binary counter with the outputs connected to the multiplexer in the selecting means, the second counter counting the outputs from the examining means.

8. The circuit of claim 2, above, wherein the frequency-generating means comprises:
   a. means for producing a periodic signal of frequency $f_o$;
   b. frequency-multiplication means for producing an output frequency that is a precise integral multiple of the signal from the frequency source, where said integral multiple is selected from a multiplicity of frequency values by a digital selection signal; and
   c. digital selection means that produces a first digital output M in a first operating mode, and a second digital output N in a second operating mode.

9. The circuit of claim 8, above, wherein the digital-selection means comprises a selection switch that produces a fixed value M in a first operating mode, and a value N related to the selection-switch position in a second operating mode.

10. The circuit of claim 1, above, wherein the digital period-measurement means comprises:
   a. a first period counter connected to the frequency-generating means and control means for accumulating and storing the number of counts that are received from the frequency-generator means during the interval that the count input is present, provided that the clear and preset inputs are not present, the counter being forced to a count of zero and maximum by application of said clear and preset inputs, respectively; and b. a second period counter connected to the frequency-generating means and control means, identical to the first period counter, having count, preset, and clear inputs separate and distinct from the count, preset and clear inputs to the first counter.

11. The circuit of claim 1, above, wherein the comparator means comprises a logic circuit for comparing the number in the first period counter with that in the second period counter, said logic circuit being arranged to signal when the numbers in said first and second counters are equal.

12. The circuit of claim 1, above, wherein the control means comprises a circuit of logic elements that causes the prescaler means, frequency-generator means, digital period-measurement means and comparator means to operate in a first mode, whereby:

a. the control means allows the prescaler means to adjust its scaling factor such that its instantaneous output frequency is less than a predetermined maximum by generating suitable control signals;

b. the control means causes the frequency-generating means to generate a periodic signal with a predetermined frequency for application to the digital period-measurement means;

c. the control means receives the output from the comparator means in order to determine if the period being measured by the digital period-measurement means is less than or not less than the value stored in the digital period-measurement means;

d. the control means causes the digital period-measurement means to store the number corresponding to the lesser value of the period measurement stored or the period measurement just measured; and e. the control means causes the digital period-measurement means to store the number corresponding to the period from the prescaler means without regard for previously stored values whenever a change in the scaling factor occurs within the prescaler means.

13. The circuit of claim 1, above, wherein the control means comprises a circuit of logic elements that causes the prescaler means, frequency-generator means, digital period-measurement means, and comparator means to operate in a second mode, whereby;

a. the control means prevents any change in the scaling factor of the prescaler means;

b. the control means causes the digital period-measurement means to retain the stored value of digital period present at the start of the second operating mode;

c. the control means causes the frequency-generating means to produce a selected one of the multiplicity of frequency signals it may produce, said selected one of the multiplicity of signals not needing to remain the same during operation in said second mode; and d. the control means receives the output from the comparator means and produces therefrom an output signal only if no comparator output signal occurs in the interval between outputs from the prescaler means.

14. The circuit of claim 1, above, wherein the selection of first and second operating modes is solely determined by the presence or absence of a signal, which, when present, selects the first operating mode, and which, when absent, selects the second operating mode.

* * * * *